United States Patent [19]

Shih et al.

[11] Patent Number: 5,641,382

[45] Date of Patent: Jun. 24, 1997

[54] METHOD TO REMOVE RESIDUE OF METAL ETCH

[75] Inventors: Tsu Shih, Chuwa; Chih-Chien Hung; Yuan-Chang Huang, both of Hsin-Chu, all of Taiwan

[73] Assignee: Taiwan Semiconductor Manufacturing Company, Ltd., Hsin-Chu, Taiwan

[21] Appl. No.: 590,024

[22] Filed: Feb. 2, 1996

[51] Int. Cl.⁶ .................................................. H01L 21/00
[52] U.S. Cl. .................. 438/669; 438/705; 438/714; 438/720; 438/734
[58] Field of Search .............................. 156/643.1, 651.1, 156/656.1, 657.1, 659.11, 661.11; 437/188, 245, 246

[56] References Cited

U.S. PATENT DOCUMENTS

| | | | |
|---|---|---|---|
| 5,100,501 | 3/1992 | Blumenthal et al. | 216/67 X |
| 5,175,125 | 12/1992 | Wong | 437/188 |
| 5,200,361 | 4/1993 | Onishi | 216/67 X |

OTHER PUBLICATIONS

"Silicon Processing for the VLSI Era–vol. 1" by S. Wolf & R. Tauber, pub by Lattice Press, Sunset Beach, CA, 1986, pp. 559–564.

*Primary Examiner*—William Powell
*Attorney, Agent, or Firm*—George O. Saile; Larry J. Prescott

[57] ABSTRACT

This invention provides a method for removing metal etch residue of silicon nodules, resulting from a small percentage of silicon in the metal, without causing overetch damage to the photoresist pattern, the metal electrode pattern, or to dielectric layers. The metal conductor layer is partially etched leaving from 20 to 80 percent of the original thickness. Any residue of silicon nodules formed during this partial etching is then removed using ion bombardment. The remainder of the metal conductor layer is then etched. A short overetch period is used to remove any remaining residue of silicon nodules. The overetch period is short and there is no deterioration of the photoresist or exposed edges of the electrode pattern.

24 Claims, 3 Drawing Sheets

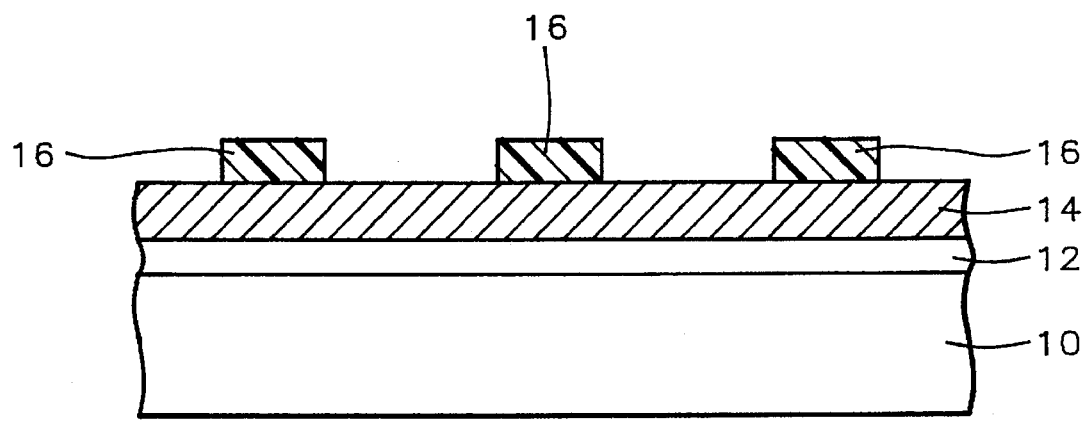
FIG. 1A – Prior Art
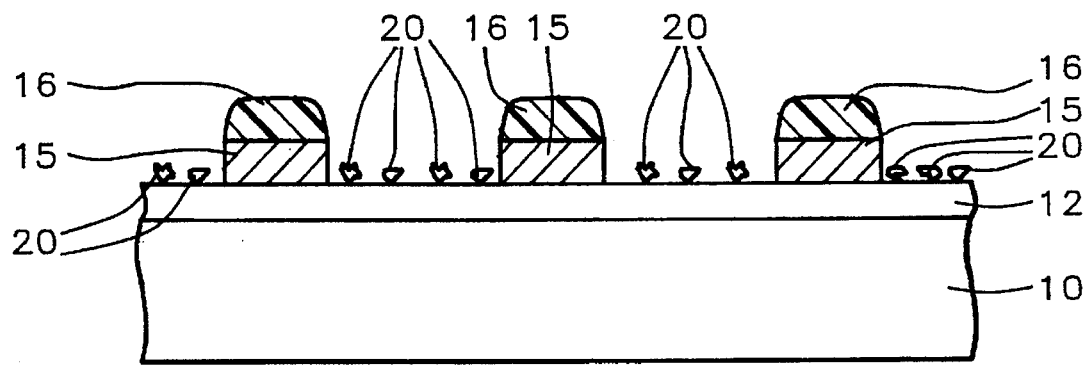
FIG. 1B – Prior Art
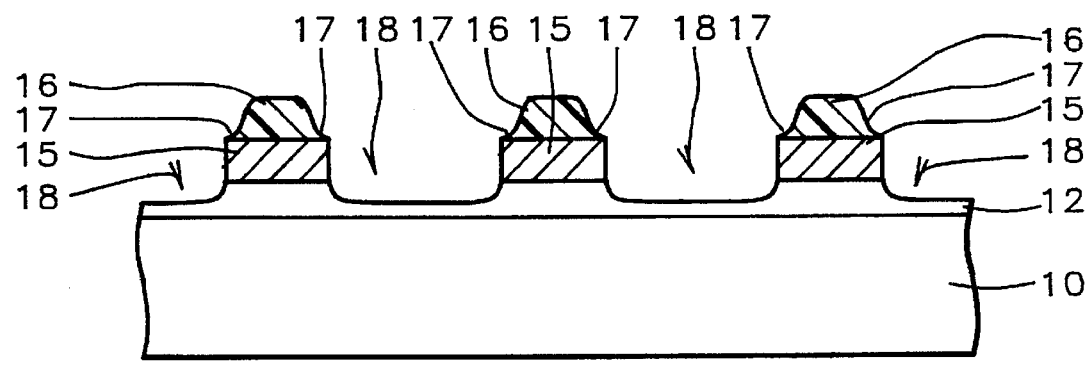
FIG. 1C – Prior Art

METHOD TO REMOVE RESIDUE OF METAL ETCH

BACKGROUND OF THE INVENTION

(1) Field of the Invention

This invention relates to the removal of metal etch residue of silicon nodules resulting from a small percentage of silicon in the conductor metal. The residue is removed using ion beam bombardment.

(2) Description of the Related Art

A small percentage of silicon is often included in conductor layers to overcome device problems. During subsequent processing involving heating and cooling steps silicon can precipitate at metal grain boundaries forming silicon nodules. These silicon nodules etch differently than the metal conductor layer and lead to residue problems after the electrode pattern has been formed.

U.S. Pat. No. 5,175,125 to Wong discusses the silicon nodule problem, but uses method to solve the problem which are different from the method taught by the invention disclosed in this Application for Patent.

The use of boron trichloride, $BCl_3$, as an etchant for aluminum is discussed in "SILICON PROCESSING FOR THE VLSI ERA—VOLUME 1, by S. Wolf and R. Tauber, published by Lattice Press, Sunset Beach, Calif. 1986, pages 559–564. The silicon nodule problem or methods to overcome this problem while etching aluminum are not discussed.

SUMMARY OF THE INVENTION

Metallization of, or the formation of conducting electrodes on, semiconductor integrated circuit elements is a critical process in the fabrication of integrated circuits. As shown in FIG. 1A, metallization is typically accomplished by the deposition of a blanket layer of metal 14, such as aluminum or aluminum copper, on a layer of dielectric 12, such as $SiO_2$, formed on the integrated circuit element 10. An electrode pattern is then formed in the metal layer using patterned photoresist 16 and etching techniques.

It has become common to include a small percentage of silicon in the metal layer to overcome device problems, such as junction shorts or contact problems, caused by preferential dissolution of silicon into the metal during subsequent processing steps. However, during subsequent processing involving heating and cooling steps silicon can precipitate at metal grain boundaries forming silicon nodules. As shown in FIG. 1B, these silicon nodules 20 can be left behind in the regions which should be free of electrode material after the etching steps used to form the electrode pattern 15 have been completed. These silicon nodules 20 can cause shorting between adjacent electrodes or can cause problems during subsequent processing steps. As these electrode patterns become more dense the problem of silicon nodules increases.

As shown in FIG. 1C, the etching time used to form the electrode pattern 15 can be increased to remove the silicon nodules but this will result in over etched regions 18 of the dielectric layer 12 and deterioration of the photoresist pattern 16 used to form the electrode pattern. The deterioration of the photoresist pattern can cause loss of photoresist at the pattern edge 17 resulting in a less desirable electrode cross section profile.

It is an object of this invention to provide a method of removing silicon nodules during the process of metal electrode formation without causing over etched regions of the dielectric layer, deterioration of the photoresist pattern, or deterioration of the metal electrode cross section profile.

BRIEF DESCRIPTION OF THE DRAWINGS

FIG. 1A shows a cross section of a prior art integrated circuit element with an oxide layer and metal conductor layer formed thereon. A patterned layer of photoresist is formed on the conductor layer.

FIG. 1B shows a cross section of a prior art integrated circuit element after forming the electrode pattern showing the silicon nodules left behind by conventional processing.

FIG. 1C shows a cross section of a prior art integrated circuit element after additional etching to remove the silicon nodules.

DESCRIPTION OF THE PREFERRED EMBODIMENTS

Figure 2:
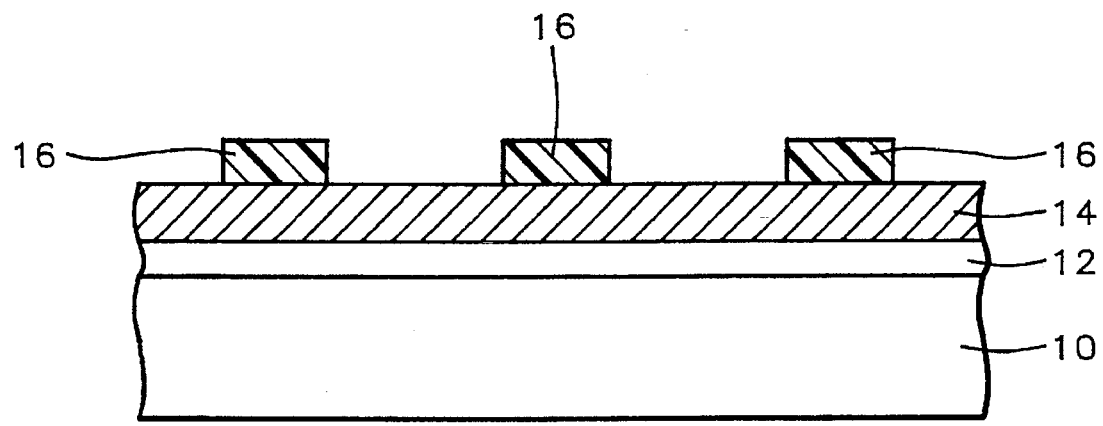
FIG. 2 shows a cross section view of an integrated circuit element with a dielectric layer and metal conductor layer formed thereon. A patterned layer of photoresist is formed on the metal conductor layer.

Refer now to FIGS. 2–7, there is shown the preferred embodiment of this invention. FIG. 2 shows a cross section view of an integrated circuit element 10 having devices, not shown, formed therein. The devices formed in the integrated circuit element can be bipolar devices, metal oxide semiconductor field effect transistor devices, complimentary metal oxide field effect transistor devices, or the like. A dielectric layer 12, for example $SiO_2$, is formed on the integrated circuit element. A conductor layer 14 of metal with between about 0.1% and 2% percent silicon and having a first thickness is formed on the dielectric layer 12. In this embodiment the first thickness is between about 2000 and 10,000 Angstroms. The conductor layer in this embodiment is aluminum/silicon/copper however materials such as aluminum/silicon, aluminum/copper, or the like could also be used. A patterned layer of photoresist 16 is formed on the conductor layer 14.

Figure 3:
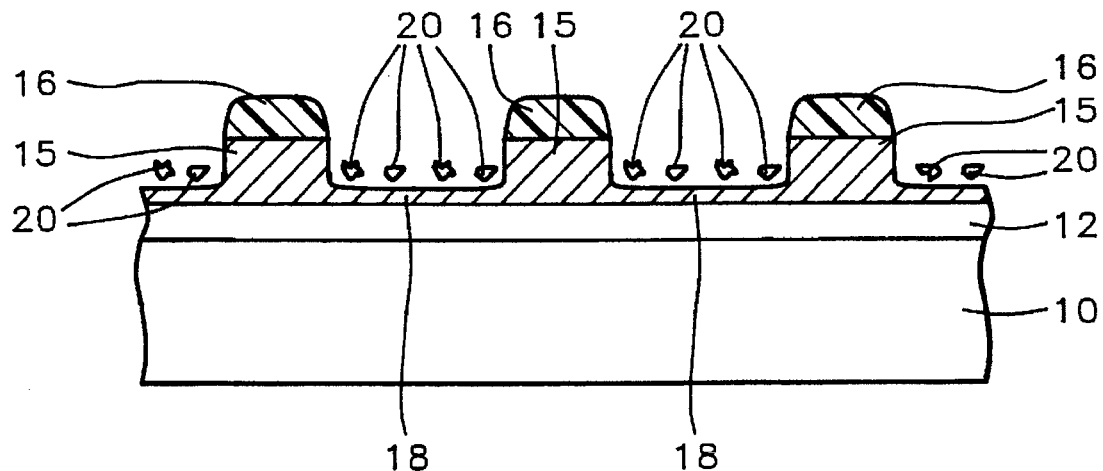
FIG. 3 shows a cross section view of the integrated circuit element after the electrode pattern has been partially etched into the metal conductor layer, thereby forming silicon nodules.

Refer now to FIG. 3. The patterned layer of photoresist 16 forms an electrode pattern which is to be transferred to the conductor layer. That part of the conductor layer which is to form the electrode pattern will be referred to as the conductor layer electrode region 15 and that part of the conductor layer which is to be etched away will be referred to as the conductor layer non-electrode region 18. Next, as shown in FIG. 3, a second thickness of the conductor layer non-electrode region 18 is etched away using dry vertical anisotropic etching. The second thickness is between about 20 and 80 percent of the first thickness.

The silicon is added to the conductor layer to overcome device problems, such as junction shorts or contact problems, caused by preferential dissolution of silicon into the metal during subsequent processing steps. Temperature cycles due to processing the integrated circuit element cause silicon nodules to form at the grain boundaries of the conductor layer. When the conductor layer is etched away using means such as dry vertical anisotropic etching, silicon nodules are less readily etched and left behind. A first quantity of silicon nodules 20 are left in the conductor layer non-electrode region after the second thickness has been etched away.

Figure 4:
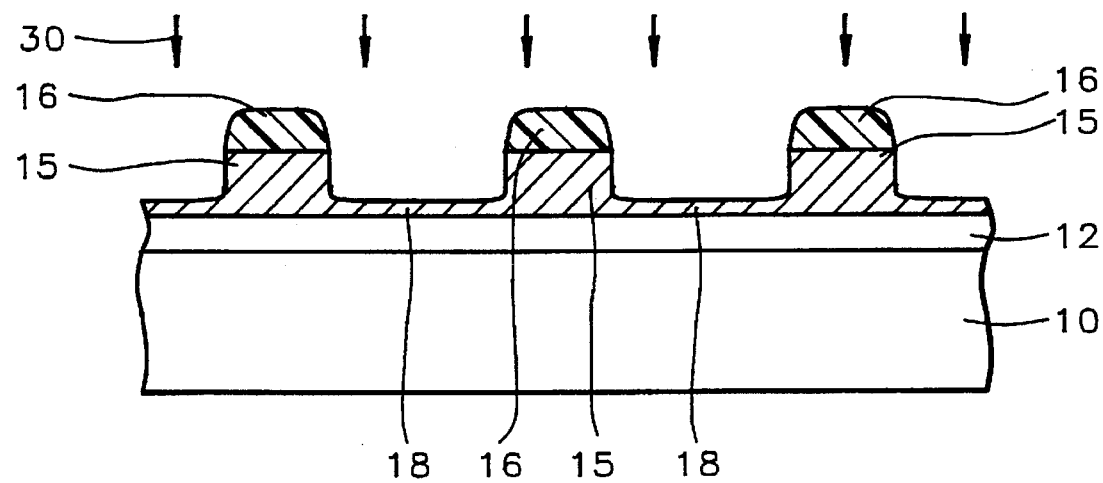
FIG. 4 is a cross section view the integrated circuit element after the electrode pattern has been partially etched into the metal conductor layer, showing the ion beam used to remove the silicon nodules.

Next, as shown in FIG. 4, the conductor layer non-electrode region 18 and the first quantity of silicon nodules are bombarded by an ion beam 30. In this embodiment the ion beam 30 consists of boron trichloride, $BCl_3$, ions with an energy of between about 200 and 300 electron volts. A beam of helium ions with an energy of between about 1000 and 1500 electron volts or a beam of argon ions with an energy of between about 400 and 600 electron volts. The ion beam used is chosen so that the ion beam removes the silicon nodules but will not remove the conductor layer metal or the photoresist. The time of the ion bombardment is not critical since by not removing the conductor layer metal or photoresist the ion beam process step to remove silicon nodules is self limiting.

Figure 5:
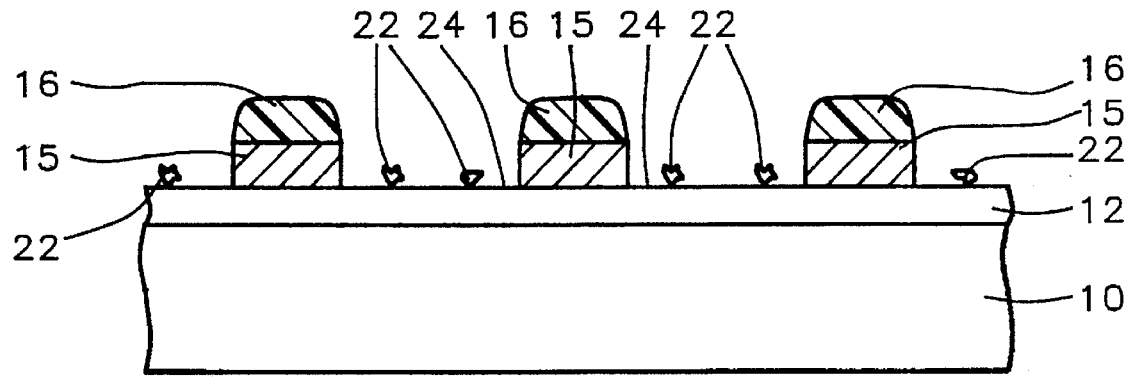
FIG. 5 shows a cross section view of the integrated circuit element after electrode pattern has been completed leaving a small number of silicon nodules.

Next, as shown in FIG. 5, the remainder of the conductor layer non-electrode region is removed using dry vertical anisotropic etching. As was the case when the second thickness of the conductor layer non-electrode region was etched away some silicon nodules 22, a second quantity of silicon nodules, will be left behind on the dielectric layer 12 in the non-electrode region 24. The second quantity of silicon nodules in a unit area will be less than 50% of the quantity of silicon nodules that would have resulted without the $BCl_3$ ion bombardment. This simplifies the problem of removing the residual silicon nodules.

Figure 6:
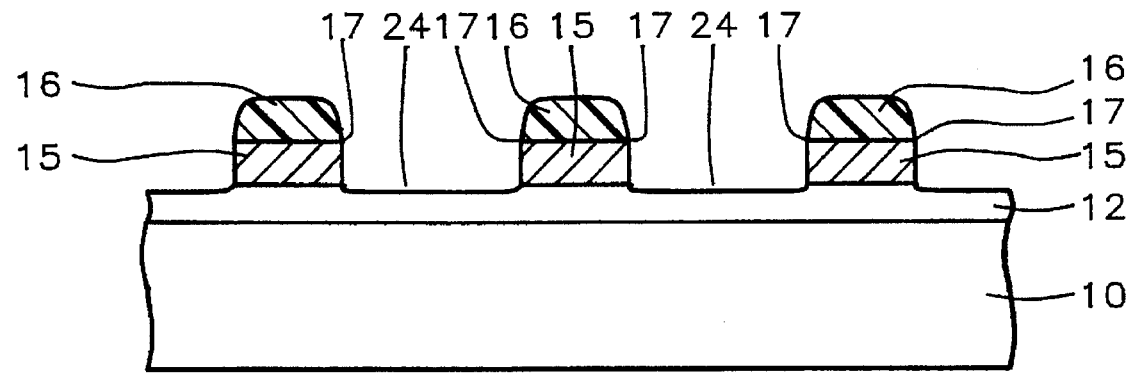
FIG. 6 shows a cross section view of the integrated circuit element after a small amount of additional etching has removed any remaining silicon nodules.

As shown in FIG. 6, the dry vertical anisotropic etching is continued for a short overetch period to remove the second quantity of silicon nodules thereby also removing a small part of the dielectric layer 12 in the non-electrode region 24. The overetch period is short and erosion of the photoresist electrode pattern 16 and the exposed edges 17 of the conductor layer electrode region 15 is negligible.

Figure 7:
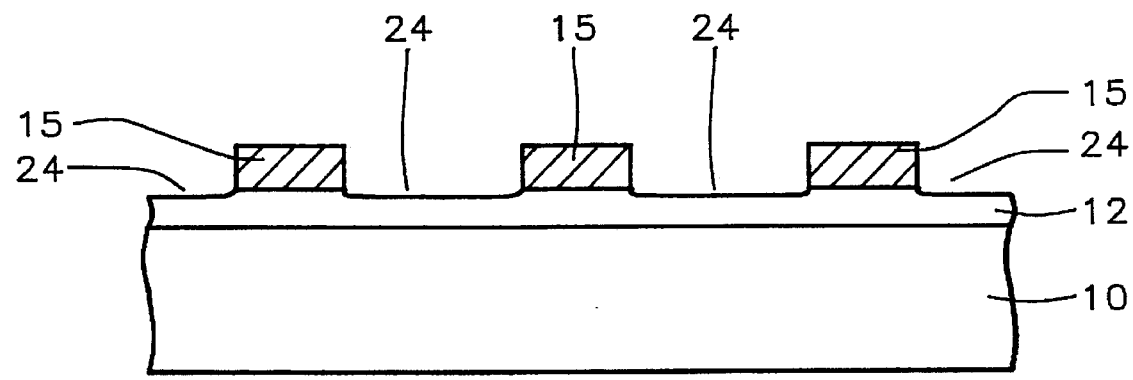
FIG. 7 shows a cross section view of the integrated circuit element after the electrode pattern has been completed and the photoresist has been stripped.

Next, as shown in FIG. 7, The photoresist is removed and the formation of the conductor layer electrode region 15 is completed.

While the invention has been particularly shown and described with reference to the preferred embodiments thereof, it will be understood by those skilled in the art that various changes in form and details may be made without departing from the spirit and scope of the invention.

What is claimed is:

1. A method for removing metal etch residue, comprising the steps of:

providing a semiconductor integrated circuit element having devices formed therein;

forming a dielectric layer on said semiconductor integrated circuit element;

forming a conductor layer having a first thickness, a conductor layer electrode region, and a conductor layer non-electrode region on said dielectric layer wherein said conductor layer comprises metal and silicon;

forming a layer of photoresist on said conductor layer;

forming an electrode pattern in said layer of photoresist whereby said conductor layer electrode region is covered by photoresist and said conductor layer non-electrode region is not covered by photoresist;

etching away a second thickness of said conductor layer non-electrode region by means of dry vertical anisotropic etching using said electrode pattern in said layer of photoresist as a mask, thereby forming a first quantity of silicon nodules on said conductor layer non-electrode region;

bombarding said conductor layer non-electrode region with boron trichloride ions using said electrode pattern in said layer of photoresist as a mask thereby removing said first quantity of silicon nodules;

removing the remaining thickness of said conductor layer non-electrode region by means of dry anisotropic etching using said electrode pattern in said layer of photoresist as a mask, thereby forming a second quantity of silicon nodules on that part of said dielectric layer not covered by said conductor electrode pattern; and etching a third thickness into that part of said dielectric layer not covered by said conductor layer electrode pattern by means of dry anisotropic etching using said electrode pattern in said layer of photoresist as a mask thereby removing said second quantity of silicon nodules.

2. The method of claim 1 wherein said conductor layer is between about 0.1 and 2 percent silicon.

3. The method of claim 1 wherein said conductor layer is aluminum/silicon.

4. The method of claim 1 wherein said conductor layer is aluminum/copper/silicon.

5. The method of claim 1 wherein said conductor layer is aluminum/copper.

6. The method of claim 1 wherein said second thickness of said conductor layer non-electrode region is between about 20 and 80 percent of said first thickness of said conductor layer.

7. The method of claim 1 wherein said dielectric layer is silicon dioxide.

8. The method of claim 1 wherein said boron trichloride ions have an energy of between about 200 and 300 electron volts.

9. A method for removing metal etch residue, comprising the steps of:

providing a semiconductor integrated circuit element having devices formed therein;

forming a dielectric layer on said semiconductor integrated circuit element;

forming a conductor layer having a first thickness, a conductor layer electrode region, and a conductor layer non-electrode region on said dielectric layer wherein said conductor layer comprises metal and silicon;

forming a layer of photoresist on said conductor layer;

forming an electrode pattern in said layer of photoresist whereby said conductor layer electrode region is covered by photoresist and said conductor layer non-electrode region is not covered by photoresist;

etching away a second thickness of said conductor layer non-electrode region by means of dry vertical anisotropic etching using said electrode pattern in said layer of photoresist as a mask, thereby forming a first quantity of silicon nodules on said conductor layer non-electrode region;

bombarding said conductor layer non-electrode region with helium ions using said electrode pattern in said layer of photoresist as a mask thereby removing said first quantity of silicon nodules;

removing the remaining thickness of said conductor layer non-electrode region by means of dry anisotropic etching using said electrode pattern in said layer of photoresist as a mask, thereby forming a second quantity of silicon nodules on that part of said dielectric layer not covered by said conductor electrode pattern; and etching a third thickness into that part of said dielectric layer not covered by said conductor layer electrode pattern by means of dry anisotropic etching using said electrode pattern in said layer of photoresist as a mask thereby removing said second quantity of silicon nodules.

10. The method of claim 9 wherein said conductor layer is between about 0.1 and 2 percent silicon.

11. The method of claim 9 wherein said conductor layer is aluminum/silicon.

12. The method of claim 9 wherein said conductor layer is aluminum/copper/silicon.

13. The method of claim 9 wherein said conductor layer is aluminum/copper.

14. The method of claim 9 wherein said second thickness of said conductor layer non-electrode region is between about 20 and 80 percent of said first thickness of said conductor layer.

15. The method of claim 9 wherein said dielectric layer is silicon dioxide.

16. The method of claim 9 wherein said helium ions have an energy of between about 1000 and 1500 electron volts.

17. A method for removing metal etch residue, comprising the steps of:

providing a semiconductor integrated circuit element having devices formed therein;

forming a dielectric layer on said semiconductor integrated circuit element;

forming a conductor layer having a first thickness, a conductor layer electrode region, and a conductor layer non-electrode region on said dielectric layer wherein said conductor layer comprises metal and silicon;

forming a layer of photoresist on said conductor layer;

forming an electrode pattern in said layer of photoresist whereby said conductor layer electrode region is covered by photoresist and said conductor layer non-electrode region is not covered by photoresist;

etching away a second thickness of said conductor layer non-electrode region by means of dry vertical anisotropic etching using said electrode pattern in said layer of photoresist as a mask, thereby forming a first quantity of silicon nodules on said conductor layer non-electrode region;

bombarding said conductor layer non-electrode region with argon ions using said electrode pattern in said layer of photoresist as a mask thereby removing said first quantity of silicon nodules;

removing the remaining thickness of said conductor layer non-electrode region by means of dry anisotropic etching using said electrode pattern in said layer of photoresist as a mask, thereby forming a second quantity of silicon nodules on that part of said dielectric layer not covered by said conductor electrode pattern; and etching a third thickness into that part of said dielectric layer not covered by said conductor layer electrode pattern by means of dry anisotropic etching using said electrode pattern in said layer of photoresist as a mask thereby removing said second quantity of silicon nodules.

18. The method of claim 17 wherein said conductor layer is between about 0.1 and 2 percent silicon.

19. The method of claim 17 wherein said conductor layer is aluminum/silicon.

20. The method of claim 17 wherein said conductor layer is aluminum/copper/silicon.

21. The method of claim 17 wherein said conductor layer is aluminum/copper.

22. The method of claim 17 wherein said second thickness of said conductor layer non-electrode region is between about 20 and 80 percent of said first thickness of said conductor layer.

23. The method of claim 17 wherein said dielectric layer is silicon dioxide.

24. The method of claim 17 wherein said argon ions have an energy of between about 400 and 600 electron volts.

* * * * *